United States Patent
Lin et al.

(10) Patent No.: US 10,842,041 B2
(45) Date of Patent: Nov. 17, 2020

(54) METHOD FOR REMOTELY CLEARING ABNORMAL STATUS OF RACKS APPLIED IN DATA CENTER

(71) Applicant: AIC INC., Taoyuan (TW)

(72) Inventors: Wei-Cheng Lin, Taoyuan (TW); Po-Sheng Hsin, Taoyuan (TW); Cheng-Han Lin, Taoyuan (TW)

(73) Assignee: AIC INC., Taoyuan (TW)

( * ) Notice: Subject to any disclaimer, the term of this patent is extended or adjusted under 35 U.S.C. 154(b) by 118 days.

(21) Appl. No.: 16/362,041

(22) Filed: Mar. 22, 2019

(65) Prior Publication Data

US 2020/0305301 A1    Sep. 24, 2020

(51) Int. Cl.
  *G06F 11/30*   (2006.01)
  *G06F 9/44*    (2018.01)
  *H05K 7/14*    (2006.01)

(52) U.S. Cl.
  CPC ............ *H05K 7/1498* (2013.01); *G06F 9/44* (2013.01); *G06F 11/30* (2013.01); *G06F 11/3006* (2013.01); *G06F 11/3065* (2013.01); *H05K 7/1487* (2013.01)

(58) Field of Classification Search
  None
  See application file for complete search history.

(56) References Cited

U.S. PATENT DOCUMENTS

| | | | |
|---|---|---|---|
| 10,754,722 B1 * | 8/2020 | Lin | G06F 11/0709 |
| 2014/0277784 A1 * | 9/2014 | Mick | H05K 7/20209 700/286 |
| 2015/0232273 A1 | 8/2015 | Jau et al. | |
| 2017/0324636 A1 * | 11/2017 | Wang | H04L 43/10 |

FOREIGN PATENT DOCUMENTS

| CN | 1649314 A | 8/2005 |
|---|---|---|
| CN | 105527878 A | 4/2016 |
| TW | 201714432 A | 4/2017 |
| TW | I614601 B | 2/2018 |

OTHER PUBLICATIONS

Office Action dated Jul. 25, 2019 of the corresponding Taiwan patent application.

* cited by examiner

*Primary Examiner* — Fahmida Rahman
(74) *Attorney, Agent, or Firm* — Chun-Ming Shih; HDLS IPR Services

(57) ABSTRACT

A method for remotely clearing abnormal status of racks includes following steps: obtaining each information of a rack management controller (RMC) and multiple baseboard management controllers (BMCs) of a rack regularly by a management system; recording each operating action performed by manager through the management system; analyzing the information and the operating action by the management system for determining whether any RMC or BMC is under one of multiple default attention-statuses; and, automatically performing a remotely service re-starting procedure to one of the RMC and the BMCs for preventing the RMC or the BMC from occurring an abnormal status when the RMC or the BMC is determined keeping a connection with the management system but about to occur the abnormal status.

8 Claims, 9 Drawing Sheets

METHOD FOR REMOTELY CLEARING ABNORMAL STATUS OF RACKS APPLIED IN DATA CENTER

BACKGROUND OF THE INVENTION

1. Field of the Invention

The invention relates to a data center, and in particularly to a method for analyzing and clearing abnormal status of racks applied in the data center.

2. Description of Prior Art

General speaking, a manager of a data center may remotely manage multiple rack management controllers (RMCs) and baseboard management controllers (BMCs) of their racks and nodes in the data center through an intelligent platform management interface (IPMI).

No matter what method is applied for performing the remote management procedure, the manager of the data center will get a great number of warning letters once the RMC/BMC of any rack or node is under an abnormal status. However, the manager can barely understand the core problem of the abnormal status at the moment he or she receives the warning letters. In particular, the manager has to be notified overtime and then realizes that the RMC/BMC is definitely under a certain abnormal status eventually until he or she has received hundreds of thousands of warning letters or the data center loses the connection with the rack/node.

Further, a part of the management platforms in the market may collect the error messages of the racks/nodes through different monitoring channels, and it may consolidate these error messages and render a failure assessment report to the manager. However, the above monitoring approach still needs the manager to judge according to the failure assessment report for making a final decision aim at the abnormal status, so there will always be a misjudgment with human intervention.

According to the above issue, a new system/method is needed in the field which can automatically perform a recovering procedure to the RMC/BMC that is under an abnormal status from a remote-end, so as to strengthen the monitoring ability of a data center. Also, the management for the racks can be highly automated, so as to shorten the time wasted by human decision and also prevent the management from misjudgment due to human intervention.

SUMMARY OF THE INVENTION

The object of the present invention is to provide a method for remotely clearing abnormal status of racks applied in data center, which may automatically perform a remote service restarting procedure to an RMC or a BMC in a rack for preventing the RMC or the BMC from getting into the abnormal status whenever the RMC or the BMC is determined having a normal connection but the abnormal status is about to occur to the RMC or the BMC.

In one of the exemplary embodiments, the method of the present invention at least including the following steps: regularly obtaining each information of an RMC and multiple BMCs in a rack by a rack server management system from a remote-end; recording each operation behavior performed by a manager through the rack server management system; analyzing the information and the operation behavior by the rack server management system for determining whether any of the RMC and the BMCs in the rack is under one of multiple pre-determined attention-conditions.

When determine that one of the RMC or the BMCs has a normal connection with the rack server management system but the abnormal status is about to occur to the RMC or the BMC, the rack server management system automatically performs a remote service restarting procedure to such RMC/BMC for preventing the RMC or the BMC from getting into such abnormal status.

In comparison with related art, the method disclosed in the present invention performs analyses and remote recovering procedures through a rack server management system connected and communicated with the rack in the data center, so the traditional human decision made by the manager for judging the abnormal status is no longer necessary. Therefore, the management cost in monitoring the rack can be reduced. Also, there's no human intervention in monitoring the rack, so the traditional effect of distance and time can be obviated as well.

DETAILED DESCRIPTION OF THE INVENTION

In cooperation with the attached drawings, the technical contents and detailed description of the present invention are described thereinafter according to a preferable embodiment, being not used to limit its executing scope. Any equivalent variation and modification made according to appended claims is all covered by the claims claimed by the present invention.

The present invention discloses a method for remotely clearing abnormal status of racks (referred to as the clearing method hereinafter), the clearing method is mainly applied for a data center to assist a manager of the data center in monitoring, analyzing and clearing different kinds of abnormal statuses within the data center.

Figure 1:
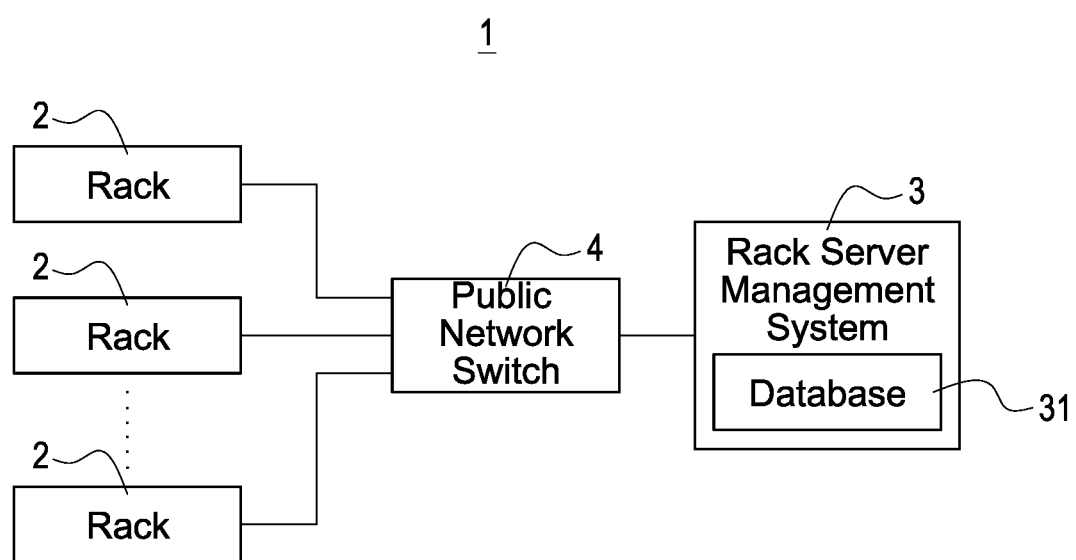
FIG. 1 is a schematic diagram showing a data center of the present invention.

FIG. 1 is a schematic diagram showing a data center of the present invention. As shown in FIG. 1, a data center 1 in the present invention includes multiple racks 2, and also includes a rack server management system 3 (referred to as the management system 3 hereinafter) remotely connected and communicated with the multiple racks 2. The management system 3 may be located directly in the data center 1. However, the management system 3 may also be located at a remote-end out of the data center 1. In this scenario, the management system 3 may be connected to a public network switch 4 through the Internet, and connected to the multiple racks 2 in the data center 1 through the public network switch 4.

The management system 3 in the present invention may monitor the multiple racks 2 in the data center 1, retrieve each information from the multiple racks 2 and analyze the retrieved information, in real-time. Whenever the management system 3 notices that one of the racks 2 is under an abnormal status or an abnormal status is about to occur to any of the racks 2, it may automatically perform one of multiple preset processing procedures corresponding to the abnormal status for clearing such abnormal status from the rack 2. Therefore, the technical solution provided by the present invention may clear an existing abnormal status from the racks 2 or prevent the racks 2 from an upcoming abnormal status without any human intervention, so as to eliminate human misjudgment and speed up the entire processing procedure.

In one embodiment, the management system 3 is a personal computer (PC) or a cloud server, which is embedded with one or more central processing units (CPUs). After being activated, the management system 3 may connect to the multiple racks 2 in the data center 1 through the public network switch 4, and implement at least a monitoring procedure, a data analyzing procedure and an abnormal status clearing procedure to these racks 2 by executing specific application programs or algorithms through the one or more CPUs.

The management system 3 may also include a database 31, which is configured to temporarily or permanently store the information retrieved from the multiple racks 2 in the data center 1. In the embodiment shown in FIG. 1, the database 31 is embedded in the management system 3. However, the management system 3 in another embodiment may also be connected to one or more external databases 31, not limited thereto.

Figure 2:
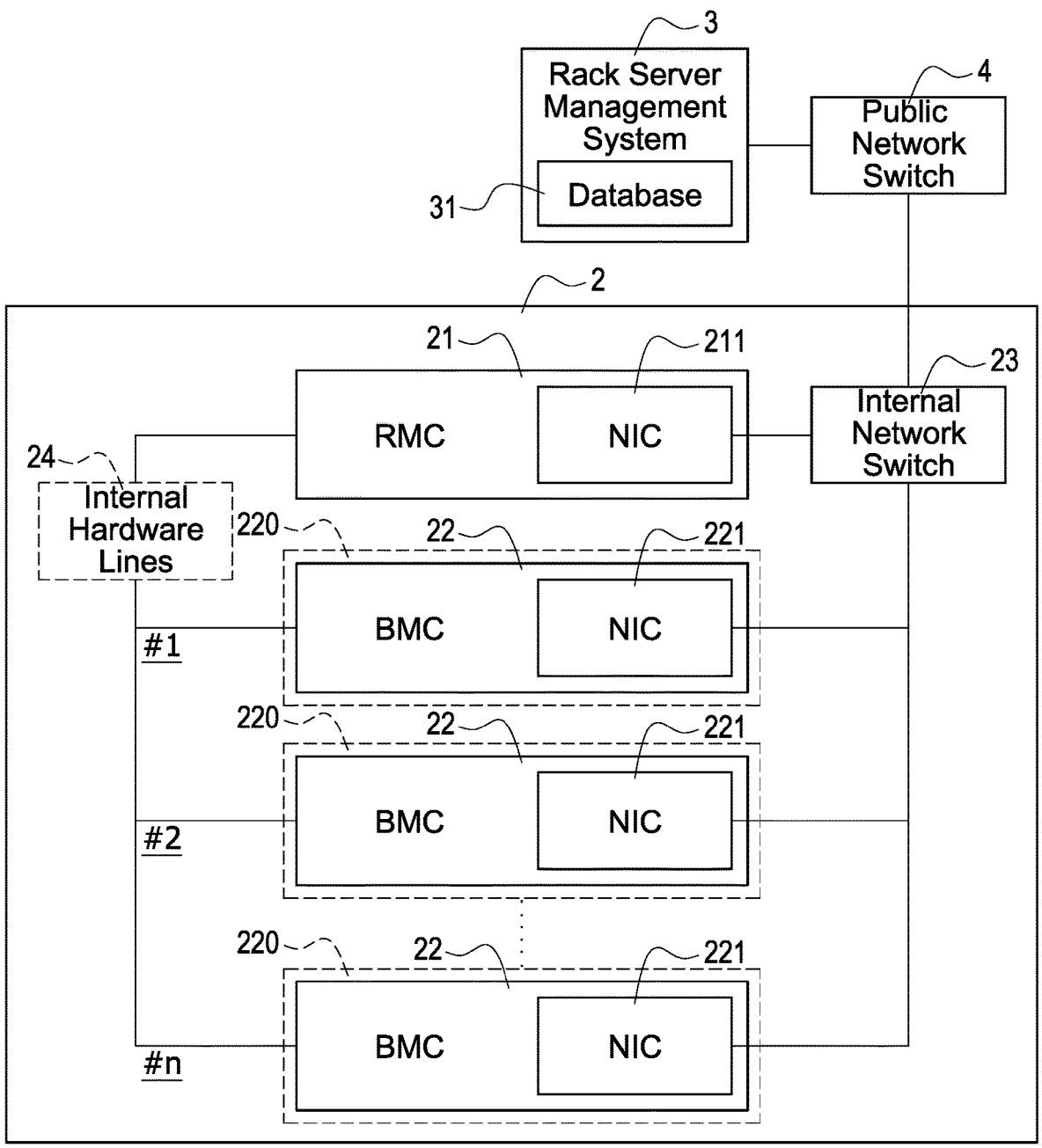
FIG. 2 is a block diagram of a rack according to a first embodiment of the present invention.

FIG. 2 is a block diagram of a rack according to a first embodiment of the present invention. In the embodiment shown in FIG. 2, one single rack 2 in the data center 1 is taken as an example to connect with the aforementioned management system 3 for describing with ease. However, the data center 1 may be arranged with multiple racks 2 according to real demand, not limited to what is disclosed in FIG. 2.

As disclosed in FIG. 2, the rack 2 mainly includes at least one rack management controller (RMC) 21, and also includes multiple nodes 220 which are connected to the RMC 21, wherein each of the nodes 220 respectively includes at least one baseboard management controller (BMC) 22. That is to say, the rack 2 at least includes one RMC 21 and a plurality of BMCs 22.

The aforementioned RMC 21 is an embedded system and is arranged inside the rack 2. The RMC 21 may assist internal hardware devices inside the rack 2, such as cooler fans, sensors, power supplies, etc., to communicate externally through different hardware lines, and also communicate with the BMC 22 of each node 220 in the rack 2. The aforementioned BMC 22 is also embedded system, which is arranged in each node 220 for assisting internal hardware devices in the node 220, such as sensors, to communicate externally with other apparatuses.

In the embodiment, the RMC 21 is connected with all BMCs 22 in the nodes 220 of the rack 2 through internal hardware lines 24, so as to communicate with each of the BMCs 22 and control each of the nodes 220 and retrieve information from the BMCs 22 and the nodes 220. In this embodiment, these nodes 220 may be, for example, tower model servers, blade servers, etc., but not limited thereto.

As disclosed in FIG. 2, each node 220 arranged in the rack 2 has a fixed location number respectively (such as #1, #2, #n as shown in FIG. 2). When the external network function of the node 220 or the BMC 22 is invalid, the RMC 21 may connect a designated location of the rack 2 (such as #1, #2, #n as mentioned above) through the internal hardware lines 24, so as to communicate with the node 220 or the BMC 22 arranged on the designated location. Therefore, even if the node 220 or the BMC 22 lost its network connection, it can still be monitored by the RMC 21 in the same rack 2, so an abnormal status of the node 220 or the BMC 22 may also be analyzed and cleared through the RMC 21.

Besides, the RMC 21 in the present invention is arranged with a network interface controller (NIC) 211, and each of the BMCs 22 is also arranged with a network internal controller 221. The RMC 21 is connected to an internal network switch 23 in the rack 2 through the NIC 211, and each of the BMCs 22 is respectively connected to the internal network switch 23 through each NIC 221. The rack 2 is connected to a public network switch 4 through the internal network switch 23, and establishes a network connection with the management system 3 through the public network switch 4. Therefore, the management system 3 may visit the rack 2 in the data center 1 from a remote-end through the Internet, and the management system 3 may inquire and retrieve each information of the RMC21 and all the BMCs 22 in the rack 2 and store the information in the database 31.

One of the technical features of the present invention is that the management system 3 may regularly visit the rack 2 for retrieving each information, such as status data, event log, usage rate of system resources, sensor value of internal sensors in the nodes 220, etc., of the RMC 21 and BMCs 22 in the rack 2, and actively analyzes whether the RMC 21 and the BMCs 22 are now under an abnormal status or whether an abnormal status is about to occur according to the retrieved information. If the management system 3 determines that a procedure is necessary to be performed after analyzing the above information, it may actively perform a corresponding procedure remotely for clearing the existing abnormal status for the RMC 21 or the BMCs 22 from the remote-end or for preventing the RMC 21 or the BMCs 22 from occurring the predicted abnormal status.

Figure 3A:
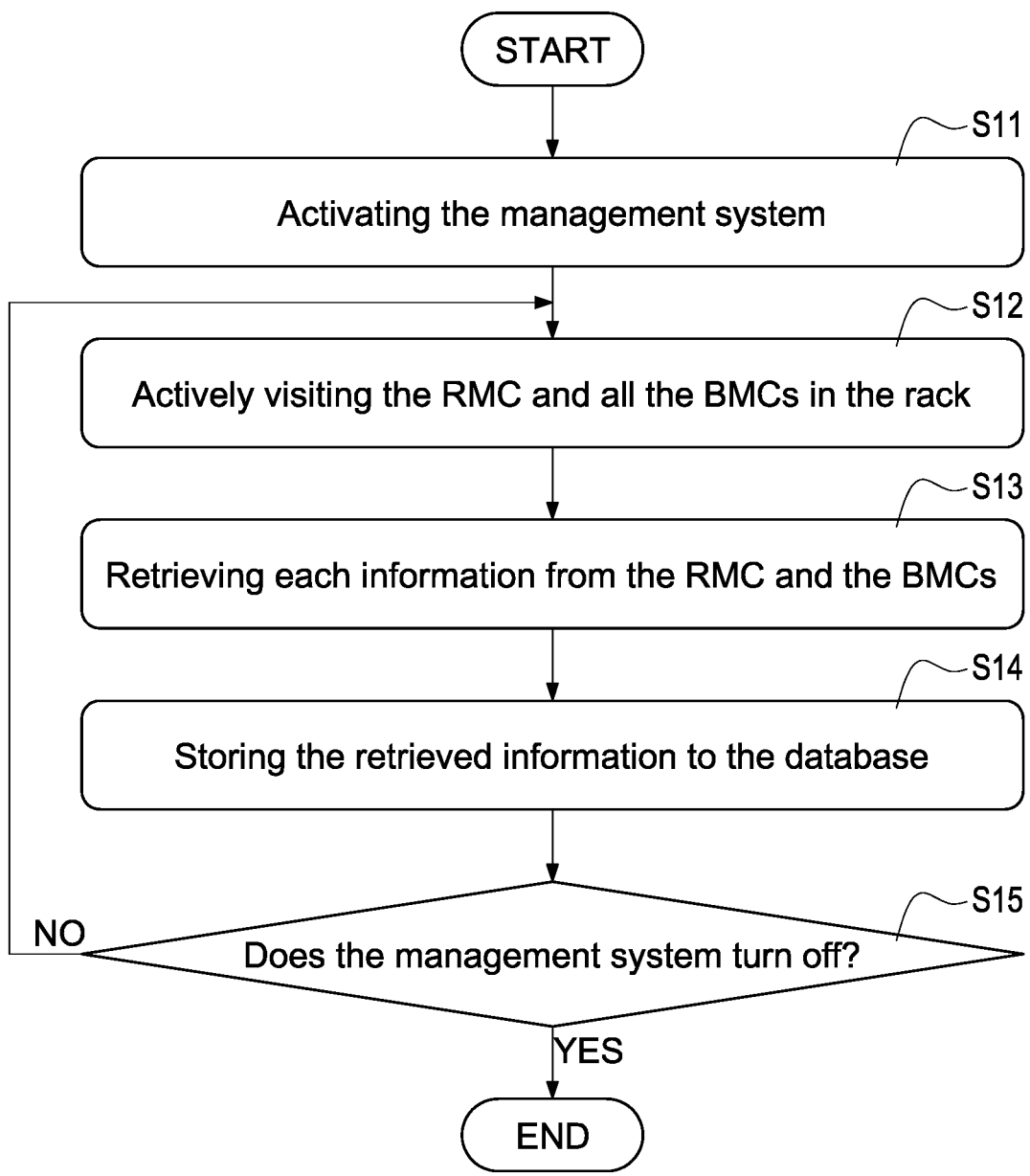
FIG. 3A is a data collecting flowchart according to a first embodiment of the present invention.

The technical solution provided by the present invention may deal with the abnormal statuses without human intervention, so as to reduce the possibility of human misjudgment and make the monitoring procedure of the rack 2 can be highly automated Please refer to FIG. 3A, which is a data collecting flowchart according to a first embodiment of the present invention.

As shown in FIG. 3A, if a manager wants to monitor a rack 2 in the data center 1, he or she can directly activate the management system 3 which located at the remote-end (step S11). After being activated, the management system 3 may perform a remote visiting procedure for actively visiting the RMC 21 and all the BMCs 22 in the rack 2 (the single rack 2 as exampled in FIG. 2) in the data center 1 from the remote-end (step S12). Also, the management system 3 may perform an information retrieving procedure for retrieving each information from the RMC 21 and all the BMCs 22 in the rack 2 through the remote visiting procedure (step S13).

The management system 3 may further perform a storing procedure for storing the retrieved information to the database 31 (step S14).

In particular, the management system 3 in this embodiment may regularly and actively visit the rack 2 after being activated, which makes the remote visiting procedure, the information retrieving procedure and the storing procedure as shown in step S12, step S13 and step S14 as a routine after the management system 3 is activated. When executing the above routine, the management system 3 keeps determining whether it is turned off or not (step S15), and the management system 3 may keep executing the step S12 to the step S14 for continually monitoring the RMC21 and the BMCs 22 in the rack 2 before it is turned off.

Figure 3B:
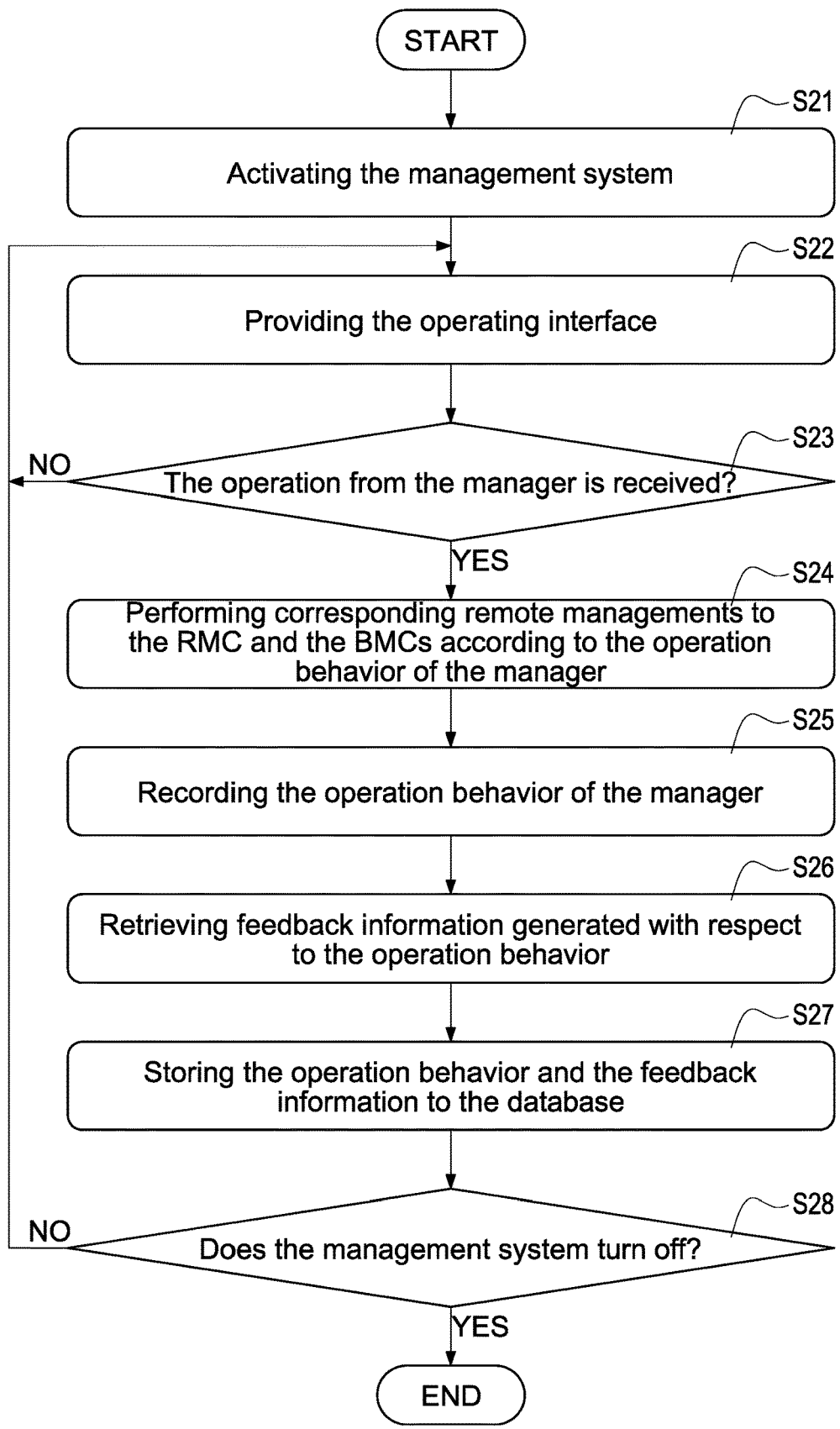
FIG. 3B is a data collecting flowchart according to a second embodiment of the present invention.

Please refer to FIG. 3B, which is a data collecting flowchart according to a second embodiment of the present invention.

After the management system 3 is activated by the manager (step S21), the management system 3 may provide an operating interface (step S22). The manager may login to the management system 3 through the operating interface, so as to monitor the information of each rack 2 in the data center 1 and control thereto through the management system 3 from the remote-end. In the embodiment, the operating interface may be a physical interface or a web interface, but not limited thereto.

After providing the operating interface, the management system 3 keeps determining whether receives an operation performed by the manager through the operating interface or not (step S23). If the management system 3 receives an operation performed by the manager, the management system 3 may perform corresponding remote managements to the rack 2, and also to the RMC 21 and the BMCs 22 in the rack 2 from the remote-end according to an operation behavior of the manager (step S24). Next, the management system 3 may record the above operation behavior performed by the manager (step S25). Also, the management system 3 may retrieve and record feedback information generated and replied from the management system 3, the rack 2, each node 220, the RMC 21 and each BMC 22 with respect to the remote managements (i.e., due to the operation behavior of the manager) (step S26). Finally, the management system 3 stores the above operation behavior and the feedback information to the database 31 (step S27) for being analyzed aim at the abnormal status in the following procedures.

Similarly, the management system 3 in the embodiment considers the actions of the step S22 to the step S27 as a routine after being activated. When executing the routine, the management system 3 keeps determining whether it is turned off or not (step S28), and the management system 3 keeps executing the step S22 to the step S27 before being turned off for continually monitoring and analyzing the effect to the RMC 21 and the BMCs 22 in the rack 2 caused by the operation behavior performed by the manager.

Figure 4:
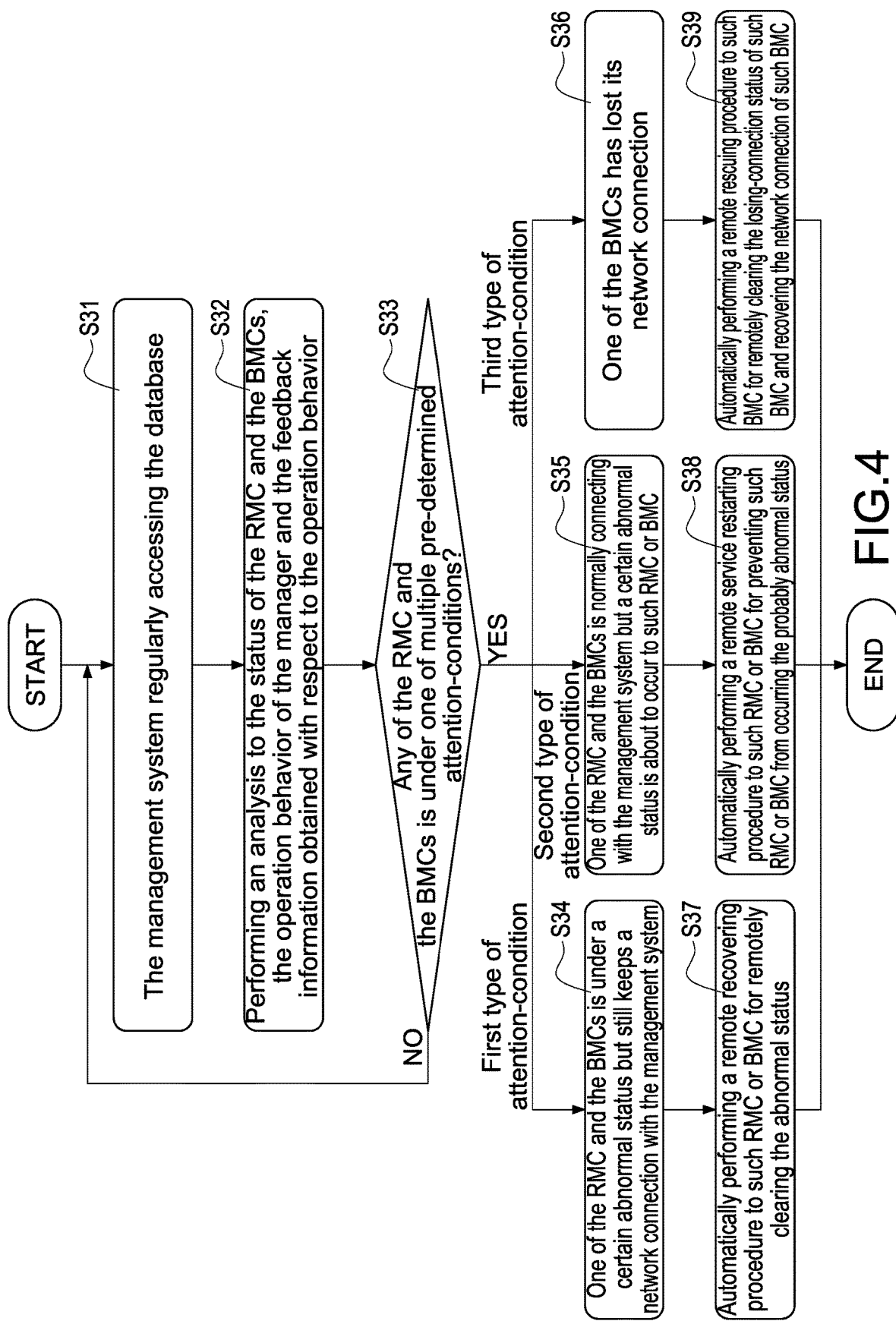
FIG. 4 is an analyzing and clearing flowchart according to a first embodiment of the present invention.

Please refer to FIG. 4, which is an analyzing and clearing flowchart according to a first embodiment of the present invention.

As shown in FIG. 4, the management system 3 may regularly access the database 31 (step S31), retrieve each information of the RMC 21 and the BMCs 22 in the rack 2, the operation behavior performed by the manager and each feedback information from the database 31 (step S32), and perform analysis to the above retrieved data. By analyzing the above data, the management system 3 may analyze whether the RMC 21 or each of the BMCs 22 in the rack 2 is under any one of multiple pre-determined attention-conditions (step S33).

In one embodiment, the management system 3 may real-time obtain each information of the RMC 21 and the BMCs 22 in the rack 2, real-time obtain the operation behavior performed by the manager through the operating interface, and then performs analysis on the obtained data. In another embodiment, the management system 3 may regularly store the above data to the database 31 through the step S14 as shown in FIG. 3A and the step S27 as shown in FIG. 3B, and regularly retrieves the above data from the database 31 for analyzing, not limited thereto.

In one embodiment, the aforementioned information of the RMC 21 and the BMCs 22 can be, for example, status data (such as in a working mode or an update mode, IP address, MAC address, subnet mask, gateway IP address, current amount of IPMI session, etc.), event log, etc., and the aforementioned operation behavior can be, for example, a data inquiring procedure, an updating procedure, a reset procedure, etc. performed by the manager aim at a specific rack 2, node 220, RMC 21 or BMC 22, but not limited thereto. By considering the aforementioned data, the management system 3 may analyze whether the rack 2 has currently an RMC 21 or a BMC 22 which needs to be rescued immediately through performing a corresponding algorithm.

In the embodiment as shown in FIG. 4, the management system 3 may pre-determine three types of attention-condition, including a first type of attention-condition, a second type of attention-condition and a third type of attention-condition, wherein these three types of attention-condition are respectively corresponding to different abnormal statuses of the RMC 21/BMC 22 and need the management system 3 to perform different procedures to clear or prevent the abnormal statuses directly from the remote-end.

As shown in FIG. 4, if the management system 3 realizes that any one of the RMC 21 and the BMCs 22 is under a certain abnormal status but still keeps a connection with the management system 3 after analyzing the above data (such as the status data, the event log and the operation behavior of the manager), it will consider that the RMC 21/BMC 22 is under the aforementioned first type of attention-condition (step S34). When realizing that one of the RMC 21 and BMCs 22 is under the first type of attention-condition, the management system 3 may automatically perform a remote recovering procedure to the RMC 21/BMC 22 which is under the first type of attention-condition, so as to remotely clear the abnormal status of the RMC 21/BMC 22 (step S37).

If the management system 3 realizes that any one of the RMC 21 and the BMCs 22 is normally connecting with the management system 3 but a certain abnormal status is about to occur to the RMC 21/BMC 22 after analyzing the above data (such as the status data of the RMC 21 and the BMCs 22), it will consider that the RMC 21/BMC 22 is under the aforementioned second type of attention-condition (step S35). When realizing that one of the RMC 21 and BMCs 22 is under the second type of attention-condition, the management system 3 may automatically perform a remote service restarting procedure to the RMC 21/BMC 22 which is under the second type of attention-condition, so as to prevent the RMC 21/BMC 22 from occurring the probably abnormal status (step S38).

If the management system 3 realizes that any one of the BMCs 22 has lost its network connection after analyzing the above data (such as the status data, operation behavior of the manager and each feedback information), it will consider that the BMC 22 is under the aforementioned third type of attention-condition (step S36). When realizing that one of the BMCs 22 is under the third type of attention-condition, the management system 3 may automatically perform a remote rescuing procedure to the BMC 22 which is under the third type of attention-condition, so as to remotely clear the losing-connection status of the BMC 22 for recovering network connection of the BMC 22 (step S39).

The aforementioned first type of attention-condition will be discussed in the following sections.

Because a part of the RMC 21/BMCs 22 does not have basic input/output system (BIOS), it has to set its time through a network time protocol (NTP) service provided by an external server or through a real-time clock (RTC) service provided by a hardware (such as a clock chip), so as to accomplish time-synchronizing with other apparatuses.

As described above, if a system event occurs before an RMC 21 or a BMC 22 finishes its time-synchronizing procedure, this system event may still be recorded in the event log of the RMC 21/BMC 22, but the time column of the event long corresponding to this system event will only be recorded with wording information such as "Pre-init" instead of an exact event-occur time indicating when the system event occurs. Without the exact event-occur time of the system event, the manager may make a misjudgment about the system event because the event log cannot be considered as a valuable reference for the system event. Besides, if the RMC 21 or the BMC 22 needs to perform a reset procedure, it may also cause the same or similar situation that the exact event-occur time of the system event has been recorded wrongly or abnormally.

Figure 5:
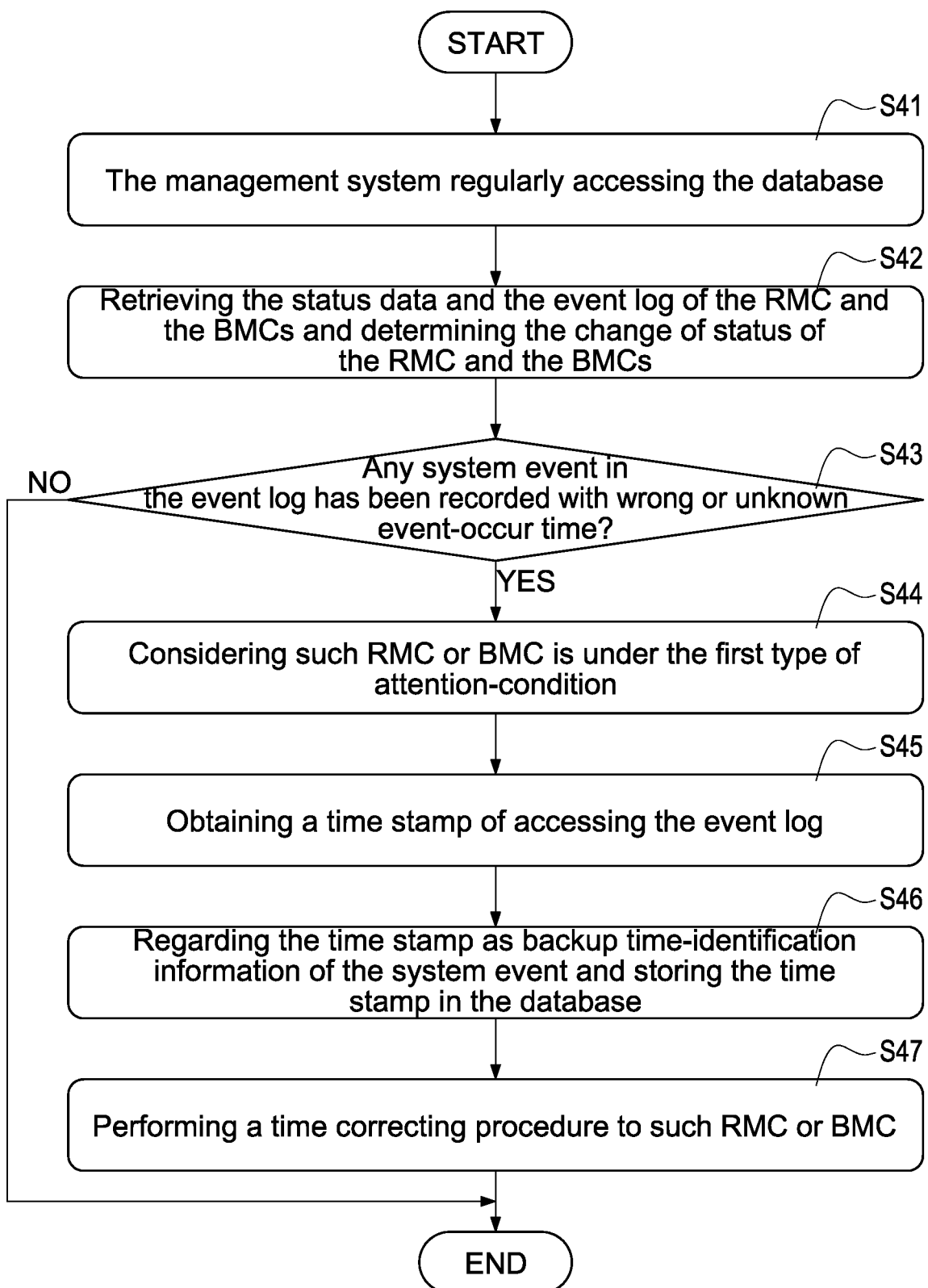
FIG. 5 is a flowchart for clearing a first type of attention-condition according to a first embodiment of the present invention.

Please refer to FIG. 5, which is a flowchart for clearing a first type of attention-condition according to a first embodiment of the present invention. In the embodiment, the management system 3 may regularly access the database 31 (step S41), retrieve the status data and the event log of the RMC 21 and all the BMCs 22 in the rack 2 from the database 31, so as to determine the change of status of the RMC 21 and the BMCs 22 (step S42).

In this embodiment, the management system 3 determines if any system event in the retrieved event log has been recorded with a wrong or unknown event-occur time (step S43). If all the system event in the event log are recorded with correct event-occur time, the management system 3 will not perform any procedure actively.

If the management system 3 realizes, after analyzing the retrieved data, that any of the RMC 21 and the BMCs 22 has at least one system event recorded in the event log with wrong or unknown event-occur time, it may consider that the RMC 21/BMC 22 is under the first type of attention-condition (step S44), i.e., the management system 3 may consider that a certain abnormal status occurs to the RMC 21/BMC 22 but the RMC 21/BMC 22 still keeps a network connection with the management system 3.

In one embodiment, the management system 3 may determine that one system event is recorded with a wrong or unknown event-occur time when the event-occur time of the system event has been recorded in the event log as "Pre-init" or similar wording information (i.e., what has been recorded in the event log related to the system event is unqualified to correctly indicate the exact event-occur time of the system event). In another embodiment, the management system 3 may determine that the system event is recorded with a wrong or unknown event-occur time once it realizes that one of the RMC 21/BMCs 22 has at least one system event recorded in the event log with unknown event-occur time after analyzing the event log, and realizes that the RMC 21/BMC 22 hasn't completed its time-synchronizing procedure yet or the RMC 21/BMC 22 needs to perform the reset procedure after analyzing the status data.

When considering that one of the RMC 21/BMCs 22 is under the first type of attention-condition at the step S44, the management system 3 first obtains a time stamp of accessing the event log (step S45), then it regards the time stamp as backup time-identification information of the system event and stores the time stamp in the database 31 (step S46). In one embodiment, the management system 3 records the time point when it accesses the database 31 for retrieving the event log and regards this time point as the above time stamp. In another embodiment, the management system 3 records the time point when it remotely visits the rack 2 for obtaining the event log directly from the RMC 21 and the BMCs 22 and regards the time point as the above time stamp, but not limited thereto.

For an instance, the original content of the event log may be like the following table:

| System event | Event-occur time |
| --- | --- |
| Event 1 | 22.12.2018/23:30:18 |
| Event 2 | Pre-Init 0000000033 |
| Event 3 | 22.12.2018/23:33:20 |

If the management system 3 accessed the event log at 23:32:23 in 22.12.2018 and realized that the event-occur time of the event 2 is wrong or unknown, it may automatically generate the aforementioned backup time-identification information for the event 2 and amend the content of the event log or create a new event log according to the amendment. In one embodiment, the amended event log or the new event log may be like the following table:

| System event | Event-occur time | Backup time |
| --- | --- | --- |
| Event 1 | 22.12.2018/23:30:18 | x |
| Event 2 | Pre-Init 0000000033 | 22.12.2018/23:32:23 |
| Event 3 | 22.12.2018/23:33:20 | x |

If the manager logs to the management system 3 through the operating interface and inquires for the event log from the management system 3, the management system 3 may display the backup time-identification information as shown in the above table as the event-occur time of the event 2. Therefore, even if a system event occurs to the RMC 21 or the BMC 22 before it completes its time-synchronizing procedure, the management system 3 may still assign an identifiable backup time for this system event. Therefore, the management system 3 and the manager may interpret the system event correctly according to the backup time, so as to improve the effect of the remote recovering procedure.

After the step S46, the management system 3 may send a control command (such as a first control command) through network to the RMC 21/BMC 22 which is currently under the first type of attention-condition, so as to perform a time correcting procedure to the RMC 21/BMC 22 which acts abnormal in time (step S47). In one embodiment, the time correcting procedure is executed to control the RMC 21/BMC 22 to perform time correction according to the NTP service. In another embodiment, the time correcting procedure is executed to force the RMC 21/BMC 22 to perform the reset procedure, but not limited thereto.

Another embodiment of the first type of attention-condition will be described in the following sections.

If the amount of the racks 2 in the data center 1 is too much, the manager of the data center 1 is hard to update each of the racks 1 manually. Accordingly, when the manager needs to perform the updating procedure to the RMC 21 and the BMCs 22 in the racks 2 (for example, firmware updating), he or she may operate the management system 3 for delivering the updating instruction and the latest-version firmware through the source code of the management system 3, so as to simultaneously update all the RMC 21/BMCs 22 of the multiple racks 2 in the data center 1.

If problems occur during the updating procedure, such as the network connection breaks due to network traffic or the unstable signal, parts of the RMC 21/BMCs 22 may not able to complete the updating procedure under the standard updating process, and it may cause a failure to the updating procedure. However, the parts of RMC 21/BMCs 22 may cause system malfunction after the failure of the updating procedure, but they may still keep the network connection (for example, they got into the update mode but cannot go back to the working mode). In this scenario, the management system 3 has to intervene from the remote-end for clearing such abnormal status.

Figure 6:
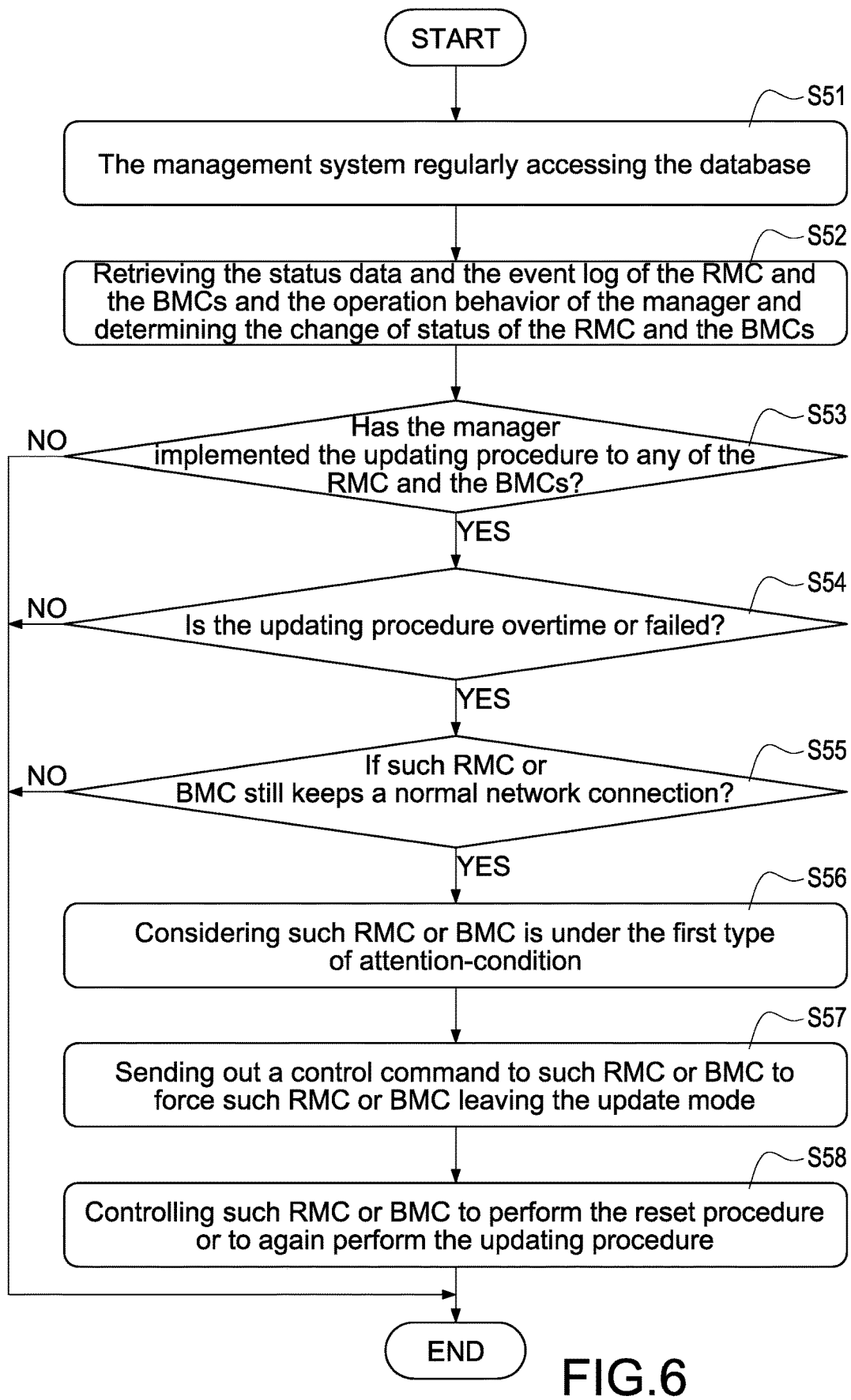
FIG. 6 is a flowchart for clearing the first type of attention-condition according to a second embodiment of the present invention.

Please refer to FIG. 6, which is a flowchart for clearing the first type of attention-condition according to a second embodiment of the present invention. In this embodiment, the management system 3 may regularly access the database 31 (step S51), so as to retrieve the status data and the event log of the RMC 21 and the BMCs 22 in the rack 2, to retrieve the operation behavior performed by the manager through the operating interface, and to determine the change of status of the RMC 21 and the BMCs 22 according to the status data, the event long and the operation behavior (step S52).

In the embodiment, the management system 3 may first analyze the status data and the event log of the RMC 21 and the BMCs 22 for determining if an updating procedure of any of the RMC 21/BMCs 22 is overtime or failed (step S54), and also analyze the status data and the event log of the RMC 21 and the BMCs 22 for determining if such RMC 21/BMC 22 still keeps a normal network connection (step S55). If the management system 3 determines, after analyzing, that one of the RMC 21/BMCs 22 is overtime or failed in the updating procedure but still keeps the network connection normal, it may consider that such RMC 21/BMC 22 is under the aforementioned first type of attention-condition (step S56), i.e., the management system 3 may consider that a certain abnormal status occurs to such RMC 21/BMC 22 but the RMC 21/BMC 22 still keeps a normal network connection with the management system 3.

More specific, the management system 3 may determine whether the manager has implemented the updating procedure to any of the RMC 21/BMCs 22 in the rack 2 or not according to the operation behavior after the step S52 (step S53). After determining that the manager has implemented the updating procedure, the management system 3 proceeds to execute the step S54 and the step S55, so as to determine whether the updating procedures of the RMC 21/BMCs 22 are overtime or failed, and also determine whether the network connections of the RMC 21/BMCs 22 are normal.

After the RMC 21/BMCs 22 accept the updating procedure implemented by the manager, they may automatically enter the update mode. In the meantime, each of the RMC 21/BMCs 22 may set a flag in its status data for indicating that it is currently in the update mode. When a peripheral device communicates with each of the RMC 21/BMCs 22 and reads the flag indicating the update mode in the status data, it may automatically stop interacting with each of the RMC 21/BMCs 22. That is to say, if one of the RMC 21/BMCs 22 fails in the updating procedure and cannot leave the update mode, this RMC 21/BMC 22 will be unable to operate normally. If the management system 3 finds out that one of the RMC 21/BMCs 22 has accepted the updating procedure and the updating procedure has been executed overtime or failed, but this RMC 21/BMC 22 has not losing its network connection, then the management system 3 may consider that the RMC 21/BMC 22 is under the aforementioned first type of attention-condition.

After the step S56, the management system 3 may send a control command (such as a second control command) to such RMC 21/BMC 22 that is under the first type of attention-condition through network, so as to force the RMC 21/BMC 22 which fails in the updating procedure to leave the update mode (step S57).

As mentioned above, even if the updating procedure is failed (i.e., cannot leave the update mode), the RMC 21/BMC 22 may still receive and process commands. The problem is that the peripheral device will automatically stop interacting with the RMC 21/BMC 22 once it reads the flag indicating the update mode. In the above embodiment, the management system 3 will ignore the flag indicating the update mode and proceed to send out the second control command directly to the RMC 21/BMC 22 to force the RMC 21/BMC 22 leaving the update mode because it has determined that a certain abnormal status occurs to the RMC 21/BMC 22.

After the step S57, the management system 3 may further send out another control command (such as a third control command) to the RMC 21/BMC 22 which has already left the update mode through network, so as to force such RMC 21/BMC 22 to perform the reset procedure, or to again perform the updating procedure (step S58). Therefore, the management system 3 may ensure that the RMC 22/BMC 22 can recover back to normal, and the firmware or software of such RMC 22/BMC 22 can be updated to the latest version.

The aforementioned second type of attention-condition will be discussed in the following sections.

The RMC 21/BMCs 22 in the present invention are embedded systems, even if the nodes 220 in the rack 2 are not turned on yet, the management system 3 may still perform the remote management procedure, such as remote boot, remote shutdown, remote inquiring, etc., through the communication with the RMC 21/BMCs 22 in the rack 2 and the nodes 220.

General speaking, when performing the remote management procedure, the manager of the data center 1 may communicate with the RMC 21/BMCs 22 in the rack 2 via sending IPMI instructions through network by using IPMI (intelligent platform management interface) tools on the management system 3. By using the IPMI tools, every IPMI instruction it sent has to first establish an IPMI session with the RMC 21 or BMC 22 of the destination, so the management system 3 can communicate with the RMC 21 or the BMC 22 of the destination after the IPMI session is established. In particular, after establishing the IPMI session, the management system 3 is allowed to communicate with the bottom hardware device of the RMC 21, the BMC 22, the rack 2 or the node 220 through network, so as to obtain a result of executing the IPMI instruction (such as firmware version, sensor value of all sensors in the node 220, etc.).

Computing resource of the embedded system is limited. However, the operation of the embedded system, the communication with the RMC 21, the communication with each BMC 22, the response to the monitoring system of the data center 1, etc., may all consume the computing resource of the embedded system (i.e., the RMC 21 or the BMC 22).

Besides, it may also consume the computing resource of the RMC 21/BMCs 22 when the management system 3 performs the remote management procedure to each of the RMC 21/BMCs 22. In particular, the remote management procedure performed by the remote management system 3 may extremely increase the amount of the IPMI session of the RMC 21/BMCs 22 and cause the RMC 21/BMCs 22 fails to respond or timeout. In this scenario, although the RMC 21/BMCs 22 is not under an abnormal status yet, but the management system 3 may have to intervene from the remote-end to prevent the RMC 21/BMCs 22 from the possible abnormal status.

Figure 7:
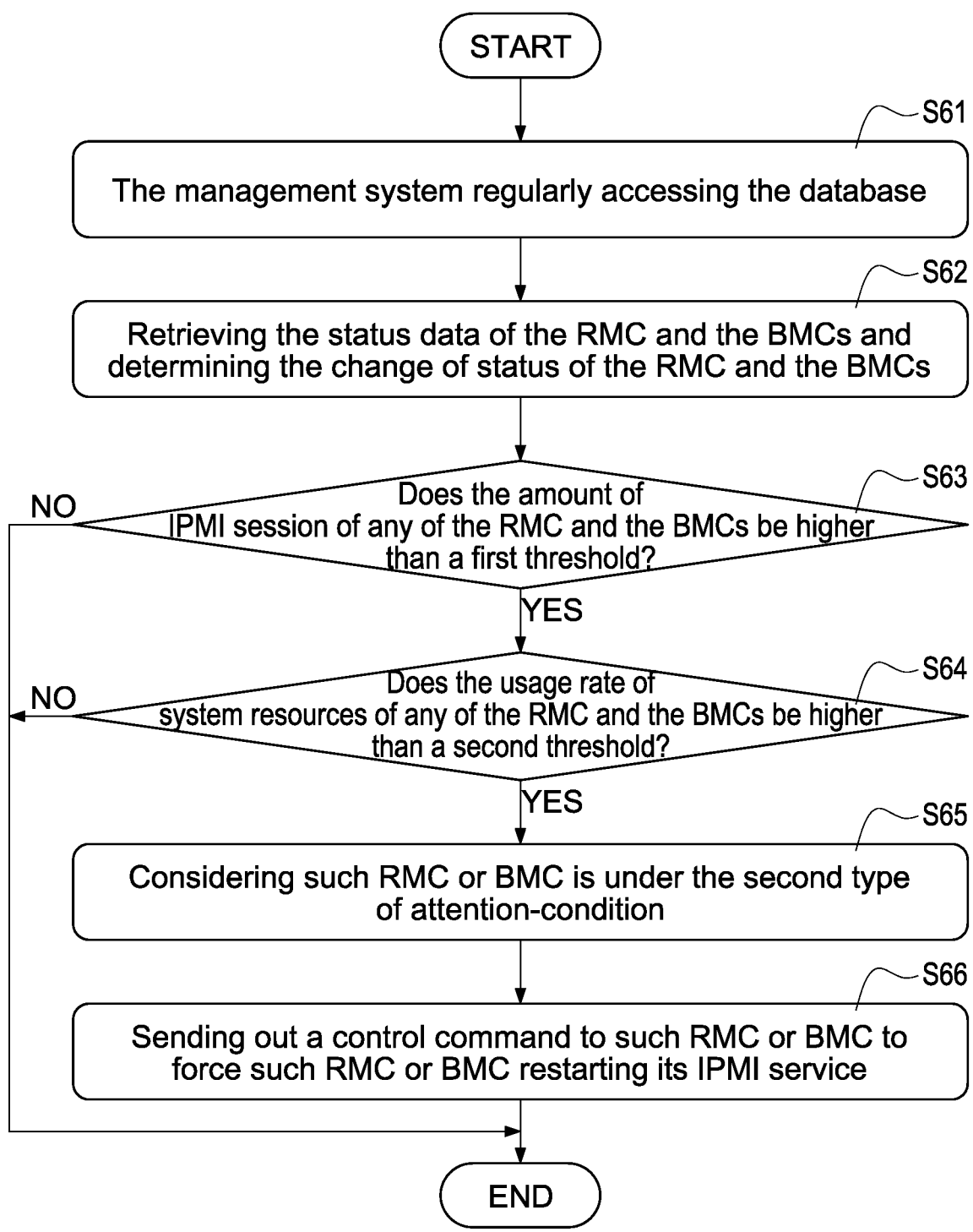
FIG. 7 is a flowchart for clearing a second type of attention-condition according to a first embodiment of the present invention.

Please refer to FIG. 7, which is a flowchart for clearing a second type of attention-condition according to a first embodiment of the present invention. In the embodiment, the management system 3 may regularly access the database 31 (step S61), retrieve the status data of the RMC 21/BMCs 22 in the rack 2 from the database 31 for determining the change of the status of the RMC 21/BMCs 22 (step S62). In one embodiment, the management system 3 in the step S62 is to obtain the current amount of IPMI session of the RMC 21 and each of the BMCs 22. In another embodiment, the management system 3 in the step S62 obtains the current usage rate of system resources of the RMC 21 and each of the BMCs 22 as well.

After the step S62, the management system 3 determines if any of the RMC 21/BMCs 22 has an amount of IPMI session higher than a first threshold (step S63), and considers an RMC 21/BMC 22 is under the aforementioned second type of attention-condition when determining that the amount of IPMI session of such RMC 21/BMC 22 is higher than the first threshold (step S65), i.e., the management system 3 may consider that such RMC 21 or BMC 22 keeps a normal network connection with the management system 3 but a certain abnormal status is about to occur to such RMC 21/BMC 22.

It is worth saying that if the management system 3 obtains the usage rate of system resources of the RMC 21 and each of the BMCs 22 in the step S62, the management system 3 may simultaneously determine if any of the RMC 21/BMCs 22 has a usage rate of system resources higher than a second threshold (step S64). In this scenario, the management 3 may consider an RMC 21/BMC 22 is under the second type of attention-condition when determining that the current amount of IPMI session of such RMC 21/BMC 22 is higher than the first threshold and the usage rate of system resources of such RMC 21/BMC 22 is higher than the second threshold.

In one embodiment, the usage rate of system resources includes the usage rate of the CPU or memory of the RMC 21/BMCs 22. In another embodiment, the usage rate of system resources may be the usage rate of certain system resources inside the RMC 21/BMCs 22 which are used for providing each service such as hyper test transfer protocol (HTTP) service, IPMI service, etc., but not limited thereto.

After confirming that one of the RMC 21/BMCs 22 is under the second type of attention-condition, the management system 3 may further send out a control command (such as a fourth control command) to such RMC 21/BMC 22 which is under the second type of attention-condition through network to make such RMC 21/BMC 22 restarting its IPMI service (step S66).

Therefore, such RMC 21/BMC 22 may empty the accumulated IPMI sessions, so as to prevent itself from occurring the abnormal status.

In one embodiment, the fourth control command is a reset command. The management system 3 sends out the reset command to the RMC 21/BMC 22 which is under the second type of attention-condition through network, so as to force the RMC 21/BMC 22 to perform the reset procedure. Therefore, the reset RMC 21/BMC 22 may restart its IPMI service. However, the above description is just one of the exemplary embodiments of the present invention, but not limited thereto.

By performing the above technical solution, the management system 3 may realize in advance that a certain abnormal status is about to occur to the RMC 21/BMCs 22 through analyzing, and actively performs the remote service restarting procedure to the RMC 21/BMCs 22 for preventing such RMC 21/BMCs 22 from occurring the abnormal status and affecting the operation of the rack 2.

The aforementioned third type of attention-condition will be discussed in the following sections.

As mentioned above, the management system 3 in the present invention may communicate with the RMC 21/BMCs 22 in the rack 2 in the data center 1 through network, and the manager may perform the remote management procedure to these RMC 21/BMCs 22 through network too. Hence, if the BMCs 22 of the rack 2 lose their network connection, the management system 3 will not able to communicate with these BMCs 22, and the manager cannot manage these BMCs 22 as well. In the embodiment, the abnormal status of the BMCs 22 in losing network connection may be caused by the setting error of IP address.

Generally, the IP address of each of the BMCs 22 in the rack 2 may be set as a dynamic IP address (i.e., the network mode of the BMC 22 is set as a dynamic IP mode) or a static IP address (i.e., the network mode of the BMC 22 is set as a static IP mode). If the network mode of a BMC 22 is set as the dynamic IP mode, a dynamic host configuration protocol (DHCP) server (not shown) in the data center 1 may actively assign a dynamic IP address to the BMC 22. If the network mode of a BMC 22 is set as the static IP mode, the manager of the data center 1 may manually set a static IP address to the BMC 22 through the operating interface provided by the management system 3.

In order to perform the network setting procedure to each BMC 22 in the rack 2 for setting a static IP address, the manager has to send at least four instructions to the BMC 22 through the management system 3 (i.e., at least four IPMI sessions have to be established), including: (1) setting the network mode of the BMC 22 as the static IP mode; (2) setting a static IP address to the BMC 22; (3) setting a subnet mask to the BMC 22; and (4) setting a gateway IP address to the BMC 22.

As mentioned above, if the manager set a wrong static IP address to the BMC 22 (for example, the static IP address the manager set is identical to one of the multiple dynamic IP address the DHCP server assigned), or the manager set a wrong gateway IP address to the BMC 22, the management system 3 may be not able to connect with such BMC 22 under a certain environment where multiple subnet co-existing or a certain environment where the communication is enable only through the gateway. In this scenario, although the node 220 having such BMC 22 is still existing in the rack 2, but the management system 3 has already lost the connection with the BMC 22, so it cannot manage such BMC 22 (and also the node 220 having such BMC 22). As a result, the management system 3 may have to intervene from the remote-end to help the BMC 22 recovering its network connection.

Figure 8:
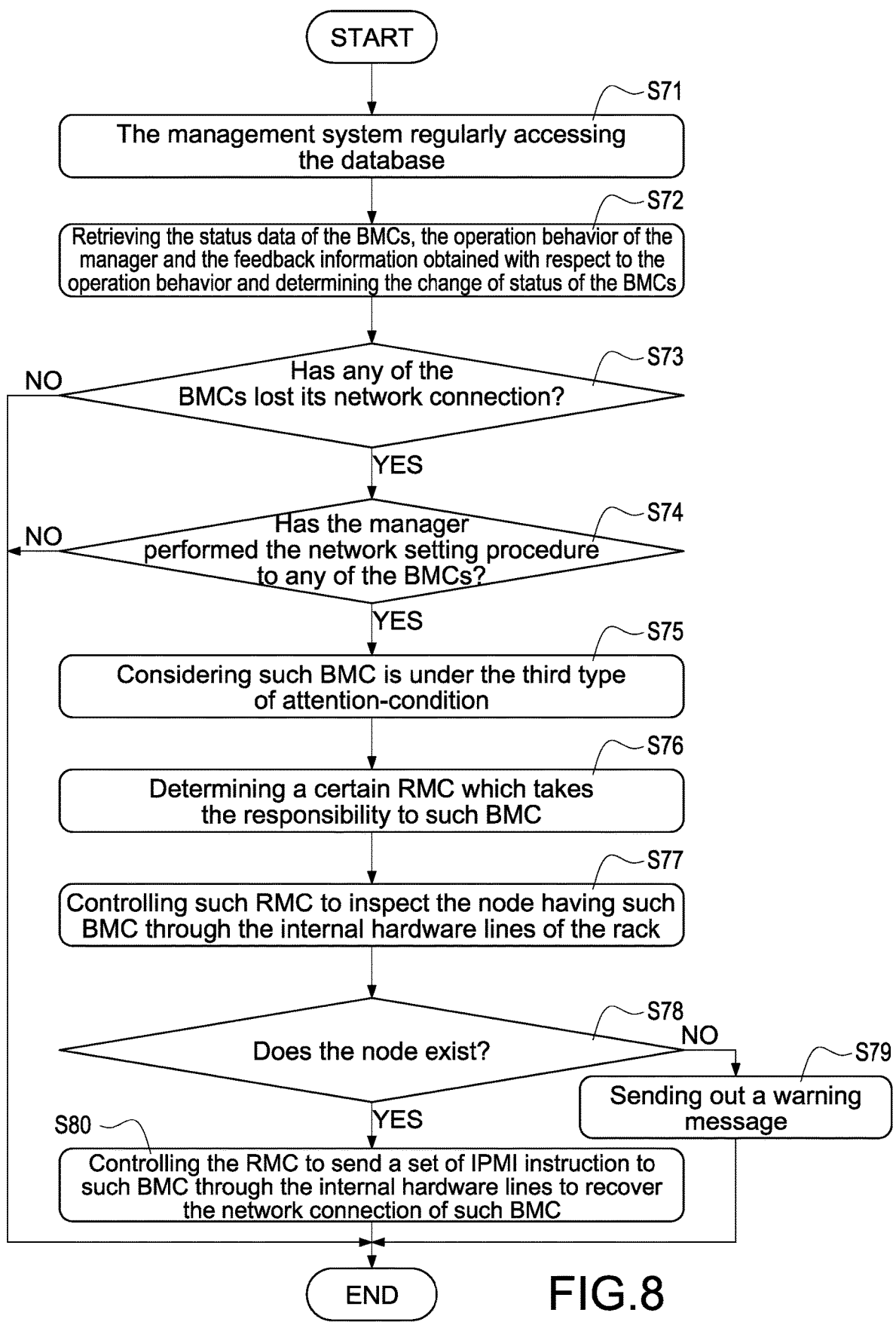
FIG. 8 is a flowchart for clearing a third type attention-condition according to a first embodiment of the present invention.

Please refer to FIG. 8, which is a flowchart for clearing a third type attention-condition according to a first embodiment of the present invention. In the embodiment, the management system 3 may regularly access the database 31 (step S71), and retrieve the status data of each BMC 22 in the rack 2, the operation behavior performed by the manager through the management system 3 and each feedback information obtained by the management system 3 based on the operation behavior from the database 31, for determining the change of status of the BMCs 22 (step S72).

In one embodiment, the status data obtained by the management system 3 in the step S72 at least includes the network mode (the static IP mode or the dynamic IP mode) of each BMC 22, the static IP address currently used by each BMC 22, the subnet mask of each BMC 22, the gateway IP address of each BMC 22, etc., not limited thereto. Also, the feedback information obtained by the management system 3 in the step S72 at least includes the feedback, the system parameters and the executing data generated by the management system 3, the rack 2 and each of the nodes 220 (and each of the BMCs 22) based on the operation behavior when the operation behavior is performed, but not limited thereto.

After the step S72, the management system 3 first determines if any of the BMCs 22 in the rack 2 has lost its network connection with the management system 3 according to the status data and the feedback information (step S73). Also, the management system 3 determines if the manager has performed the network setting procedure to any of the BMCs 22 in the rack 2 according to the operation behavior (step S74). If the management system 3 determines that the manager has just performed the network setting procedure to one of the BMCs 22 and such BMC 22 lost its network connection with the management system 3 after accepting the network setting procedure, it may consider that such BMC 22 is under the aforementioned third type of attention-condition (step S75), i.e., the management system 3 may consider that this BMC 22 has lost its network connection.

It is worth saying that, in the step S73, the management system 3 may determine that one of the BMCs 22 lost its network connection (has lost its network connection or is about to lose its network connection) when determining that the network mode of such BMC 22 is in the static IP mode and the static IP address used by such BMC 22 is identical to one of the multiple dynamic IP addresses assigned by the DHCP server.

In another embodiment, the management system 3 in the step S73 may also determine that one of the BMCs 22 lost its network connection (has lost its network connection or is about to lose its network connection) when the network mode of such BMC 22 is in the static IP mode and the gateway IP address of the BMC 22 has been set wrongly. However, the above descriptions are just few examples of the exemplary embodiments of the present invention, not limited thereto.

After the step S75, the management system 3 may consider a specific one of the BMCs 22 is under the aforementioned third type of attention-condition. Next, the management system 3 determines a certain RMC 21 in the data center 1 which takes the responsibility to such BMC 22 (step S76), and controls this RMC 21 to inspect the node 220 having such BMC 22 through the internal hardware lines 24 (step S77), so as to confirm whether the node 220 is existing or not (step S78).

As shown in FIG. 2, an RMC 21 may physically connect with all BMCs 22 of all nodes 220 in the same rack 2 through the internal hardware lines 24. Therefore, even if the BMC 22 lost its network connection, the RMC 21 in the same rack 2 may still communicate with such BMC 22 through the internal hardware lines 24.

If determining that the node 220 having such BMC 22 which lost its network connection doesn't exist in the step S78 (for example, the node 220 has been removed from the rack 2 or is damaged), the management system 3 may send out a corresponding warning message (step S79).

In one embodiment, the management system 3 may send out the warning message, such as words, lights or sounds, through the operating interface, so as to warn the manager. In another embodiment, the management system 3 may send out the warning message externally to the manager, such as text messages, e-mails or messages of communication software, through the network, so as to warn the manager.

If determining that the node 220 having such BMC 22 which lost its network connection does exist in the step S78, the management system 3 controls the RMC 21 which takes the responsibility to such BMC 22 to send a set of IPMI instruction to such BMC 22 through the internal hardware lines 24 for the BMC 22 to recover its network connection (step S80). In one embodiment, the management system 3 may send the IPMI instruction to such BMC 22 through the RMC 21, so as to amend the static IP address of the BMC 22 or the gateway IP address of the BMC 22, and makes the BMC 22 recovering its network connection (i.e., the connection with the management system 3).

By using the aforementioned technical solution, the management system 3 may actively perform the rescuing procedure to a BMC 22 from a remote-end after the BMC 22 lost its connection with the management system 3, so as to help the BMC 22 recovering its network connection.

The method disclosed in the present invention may use the management system 3 to automatically collect necessary information and analyze the status of the RMC 21 and the BMCs 22, and automatically performs a corresponding procedure for clearing the abnormal status from each of the RMC 21/BMCs 22 once any of the RMC 21/BMCs 22 is determined under one of the multiple pre-determined attention-conditions. Therefore, the technical solutions of the present invention may reduce the management cost, and get the monitoring procedure of the data center 1 away from human intervention and the effect of distance and time.

As the skilled person will appreciate, various changes and modifications can be made to the described embodiment. It is intended to include all such variations, modifications and equivalents which fall within the scope of the present invention, as defined in the accompanying claims.

What is claimed is:

1. A method for remotely clearing abnormal status of racks, applied in a data center comprising a rack and a rack server management system connected with the rack from a remote-end, wherein the rack comprises a rack management controller (RMC) and multiple nodes, each of the nodes comprises a baseboard management controller (BMC), and the method comprising following steps:

a) accessing a database regularly by the rack server management system for obtaining status data of the RMC and each of the BMCs and determining a change of status of the RMC and each of the BMCs according to the status data, wherein the step a) is obtaining a current amount of intelligent platform management interface (IPMI) session of the RMC and each of the BMCs;

b) determining if any one of the RMC and the BMCs is under one of multiple pre-determined attention-conditions according to the status data and the change of the status;

c) determining that a specific one of the RMC and the BMCs is under a second type of attention-condition of the multiple pre-determined attention-conditions based on the amount of IPMI session of the specific one of the RMC and the BMCs and d) performing a remote service restarting procedure automatically to the specific one of the RMC and the BMCs which is under the second type of attention-condition of the multiple pre-determined attention-conditions by the rack server management system after determining that the specific one of the RMC and the BMCs is under the second type of attention-condition, wherein the remote restarting procedure is performed for preventing the specific one of the RMC and the BMCs from getting into an abnormal status, and the second type of attention-condition indicates that the specific one of the RMC and the BMCs is currently having a normal connection with the rack server management system but the abnormal status is about to occur to the specific one of the RMC and the BMCs.

2. The method in claim 1, further comprising following steps:

a01) activating the rack server management system;

a02) regularly and actively visiting the RMC and each of the BMCs in the rack by the rack server management system from the remote-end after the step a01);

a03) obtaining the status data of the RMC and each of the BMCs;

a04) storing the status data to the database; and a05) continually executing the step a02) to the step a04) before the rack server management system turns off.

3. The method in claim 1, further comprising following steps:

a11) activating the rack server management system;

a12) providing an operating interface by the rack server management system after the step a11);

a13) performing a remote management procedure to the RMC and each of the BMCs according to an operation behavior when receiving the operation behavior performed by a manager through the operating interface;

a14) obtaining feedback information generated based on the performed remote management procedure;

a15) storing the operation behavior and the feedback information to the database; and a16) continually executing the step a12) to the step a15) before the rack server management system turns off.

4. The method in claim 1, wherein the step a) is further obtaining an usage rate of system resources of the RMC and each of the BMCs, the step b) is determining that the specific one of the RMC and the BMCs is under the second type of attention-condition if the amount of IPMI session of the specific one of the RMC and the BMCs is higher than a first threshold and the usage rate of system resources of the specific one of the RMC and the BMCs is higher than a second threshold.

5. The method in claim 4, wherein the usage rate of system resources is a usage rate of a CPU or a memory of the RMC and each of the BMCs.

6. The method in claim 4, wherein the usage rate of system resources is a usage rate of system resources of the RMC and each of the BMCs for providing HTTP service or IPMI service.

7. The method in claim 1, wherein the step d) is sending a control command by the rack server management system to the specific one of the RMC and the BMCs which is under the second type of attention-condition for the specific one of the RMC and the BMCs to restart an IPMI service.

8. The method in claim 7, wherein the step d) is sending a reset command by the rack server management system to the specific one of the RMC and the BMCs which is under the second attention-condition to perform a reset procedure to force the specific one of the RMC and the BMCs for restarting the IPMI service.

* * * * *